United States Patent
Thornton et al.

(10) Patent No.: US 11,255,921 B2
(45) Date of Patent: Feb. 22, 2022

(54) RV ELECTRICAL OUTLET TESTER

(71) Applicant: Brunswick Corporation, Mettawa, IL (US)

(72) Inventors: Karl E. Thornton, Kewaskum, WI (US); Joseph A. Schlaikowski, Milwaukee, WI (US); Matthew T. Elsner, Mukwonago, WI (US); David M. Schneider, New Berlin, WI (US)

(73) Assignee: Brunswick Corporation, Mettawa, IL (US)

( * ) Notice: Subject to any disclaimer, the term of this patent is extended or adjusted under 35 U.S.C. 154(b) by 0 days.

(21) Appl. No.: 16/745,925

(22) Filed: Jan. 17, 2020

(65) Prior Publication Data
US 2021/0223331 A1    Jul. 22, 2021

(51) Int. Cl.
 G01R 31/54 (2020.01)
 G01R 31/52 (2020.01)
 (Continued)

(52) U.S. Cl.
 CPC ......... G01R 31/54 (2020.01); G01R 1/06788 (2013.01); G01R 31/006 (2013.01); G01R 31/52 (2020.01)

(58) Field of Classification Search
 CPC ............... G01R 31/006; G01R 31/06788; G01R 31/50; G01R 31/52; G01R 31/54;
 (Continued)

(56) References Cited

U.S. PATENT DOCUMENTS 4,127,807 A * 11/1978 Peplow ............... G01R 31/67
 324/508
5,109,200 A * 4/1992 Dushane ............. G01R 31/50
 324/508

(Continued)

OTHER PUBLICATIONS

Power Protection/RVing Outside RV Gander Outdoors ,Progressive Industries PSK-50 Portable Surge Protector Kit, 50-Amp pp. 1-4,https://www.ganderoutdoors.com/rving/outside-rv/power-protection (Year: 2018).*

(Continued)

*Primary Examiner* — Patrick Assouad
*Assistant Examiner* — Demetrius R Pretlow
(74) *Attorney, Agent, or Firm* — Andrus Intellectual Property Law, LLP (57) ABSTRACT

An electrical outlet tester for testing a power outlet for powering a recreational vehicle includes outlet tester circuitry configured to test wiring of a power outlet for powering a recreational vehicle to detect a plurality of wiring conditions. The electrical outlet tester includes and a set of light indicators connected to the outlet tester circuitry so as to indicate each of the plurality of wiring conditions detectable by the outlet tester circuitry. The set of light indicators includes a first group of light indicators configured to indicate a plurality of fault condition types and a second group of light indicators configured to indicate one or more lines affected by the fault condition type indicated on the first group of light indicators. A housing surrounds the outlet tester circuitry and a plug extends from the housing and is configured to galvanically connect to the power outlet in order to facilitate testing thereof.

19 Claims, 4 Drawing Sheets

(51) Int. Cl.
*G01R 1/067* (2006.01)
*G01R 31/00* (2006.01)

(58) Field of Classification Search
CPC ........ G01R 31/55; G01R 31/56; G01R 31/58; G01R 31/60; G01R 31/66–67; G01R 31/69
See application file for complete search history.

(56) References Cited

U.S. PATENT DOCUMENTS

| | | | | |
|---|---|---|---|---|
| 5,285,163 A * | 2/1994 | Liotta | ............ | G01R 31/58 |
| | | | | 324/508 |
| 5,642,052 A * | 6/1997 | Earle | ............ | G01R 31/52 |
| | | | | 324/556 |
| 6,020,822 A * | 2/2000 | Marshall | ............ | G01R 19/155 |
| | | | | 324/133 |
| 6,072,317 A | 6/2000 | Mackenzie | | |
| 6,731,217 B1 * | 5/2004 | Warner | ............ | G01R 31/52 |
| | | | | 340/650 |
| 8,866,485 B1 * | 10/2014 | Lacey | ............ | G01R 31/69 |
| | | | | 324/508 |
| 9,940,812 B2 * | 4/2018 | Schroeder | ............ | H01H 71/04 |
| 2004/0174173 A1 | 9/2004 | Elms et al. | | |
| 2005/0275409 A1 * | 12/2005 | Mason | ............ | G01R 31/69 |
| | | | | 324/508 |
| 2006/0132143 A1 * | 6/2006 | Sears | ............ | G01R 31/69 |
| | | | | 324/508 |
| 2008/0042657 A1 * | 2/2008 | Radle | ............ | G01R 31/69 |
| | | | | 324/508 |
| 2009/0045817 A1 | 2/2009 | Savicki, Jr. et al. | | |
| 2009/0212785 A1 * | 8/2009 | Radle | ............ | G01R 31/69 |
| | | | | 324/508 |
| 2009/0278524 A1 * | 11/2009 | Calcaterra | ............ | G01R 31/69 |
| | | | | 324/66 |
| 2009/0303062 A1 * | 12/2009 | Hamilton | ............ | G01R 15/12 |
| | | | | 340/656 |
| 2012/0200299 A1 * | 8/2012 | Stanton | ............ | G01R 1/06788 |
| | | | | 324/508 |
| 2014/0375328 A1 * | 12/2014 | Lenzie | ............ | G01R 31/67 |
| | | | | 324/508 |
| 2016/0097802 A1 * | 4/2016 | Suica | ............ | G01R 19/145 |
| | | | | 324/508 |
| 2016/0274168 A1 * | 9/2016 | Cabot | ............ | G06F 11/221 |
| 2016/0327599 A1 * | 11/2016 | Wiesemann | ............ | G01R 1/04 |
| 2016/0327601 A1 | 11/2016 | Brockman et al. | | |
| 2018/0321298 A1 * | 11/2018 | Chun | ............ | G01R 31/67 |

OTHER PUBLICATIONS

Mestek ST02 Socket Testers Voltage Test, AliExpress, https://www.aliexpress.com/item/4000042210507.html (Year: 2019).*
European search report dated Jun. 14, 2021 in counterpart European Patent Application 21151562.2.
Progressive Industries: "Which Progressive Industries Product is Best for Your Recreational Vehicle?", Jan. 1, 2017 (Jan. 1, 2017), XP055808374, Retrieved from the Internet: URL: https://www.progressiveindustries.net/portable-hardwired-comparisons.
Southwire: "Protect What You Value Most Surge Guard RV Power Protection Limited Liability Warranty with Connected Equipment Coverage", Jan. 18, 2019 (Jan. 18, 2019), XP055808295, Retrieved from the Internet: URL: https://rvpower.southwire.com/wp-content/uploads/2019/02/SW-SurgeGuard-Brochure-Update.pdf.
Anonymous: "Progressive Industries PSK-50", May 27, 2021 (May 27, 2021), XP055808458, Retrieved from the Internet: URL:https://www.campingworld.com/progressive-industries-psk-50-portable-surge-protector-kit-50-amp-122451.html.
Anonymous: "Progressive Industries PSK-30", May 27, 2021 (May 27, 2021), XP055808457, Retrieved from the Internet: URL:https://www.campingworld.com/progressive-industries-psk-30-portable-surge-protector-kit-30-amp-122450.html.

* cited by examiner

RV ELECTRICAL OUTLET TESTER

FIELD

The present invention generally relates to devices for testing electrical outlets, and more particularly for devices to test electrical outlets for powering a recreational vehicle.

BACKGROUND

Faulty electrical outlets can produce damaging and even dangerous consequences if a wiring fault exists. If an electrical conductor, such as an electrical cord connected to a load a faulty power outlet that is wired incorrectly may provide too much or too little voltage or current, or cause the current to flow incorrectly, and thus can damage the systems or devices connected to the faulty outlet. Outlet testers are thus widely used to test electrical outlets and detect wiring conditions.

An outlet may also be referred to as a receptacle or a socket. Outlets have one of various existing standard configurations, which are typically dictated by domestic and/or industry standards and are configured to provide a specified standard voltage and amperage. For example, domestic-style electrical outlets standard in homes and businesses in the United States and Canada include 125 volt outlets configured to provide 15 amp or 20 amp current, and also include outlets for larger appliances, such as clothes dryers and electric ranges, configured to provide 250 volts and typically either 30 amps or 50 amps. Outlets for powering recreational vehicles (RVs) are typically either 125 volts and 30 amps, or 125/250 volts and 50 amps. Outlets for recreational vehicles have a standard plug configuration that is different than the standard plug configuration for other types of outlets so that the wrong type of outlet cannot be mistakenly used for powering a recreational vehicle. Many power pedestals for recreational vehicles providing 125/250 volt, 50 amp power outlets, are configured as split phase outlets configured with two hot (or live) lines, where each hot line is configured to provide 125 volts at opposite phases to one another.

Typical outlet testers include a series of lights that light up to indicate wiring status of the outlet. Typically, testers are configured to provide test results in a coded format. For each wiring condition (e.g. correct wiring, reverse wiring, open circuit) the outlet tester provides three or four indicator lights (one for each of the hot, neutral, and ground lines). Several lights on the tester will illuminate and a user then compares the on/off status of each of the three or four indicators for each wiring condition to a decoder chart. The decoder chart has a list of the wiring states for each of the indicator combinations, and a user compares the pattern of illuminated lights to the decoder chart to determine whether or not the outlet is correctly wired and, if not, what the problem is.

SUMMARY

This Summary is provided to introduce a selection of concepts that are further described below in the Detailed Description. This Summary is not intended to identify key or essential features of the claimed subject matter, nor is it intended to be used as an aid in limiting the scope of the claimed subject matter.

One embodiment of an electrical outlet tester for testing a power outlet for powering a recreational vehicle includes outlet tester circuitry configured to test wiring of a power outlet for powering a recreational vehicle to detect a plurality of wiring conditions. The electrical outlet tester includes a set of light indicators connected to the outlet tester circuitry so as to indicate each of the plurality of wiring conditions detectable by the outlet tester circuitry. The set of light indicators includes a first group of light indicators configured to indicate a plurality of fault condition types and a second group of light indicators configured to indicate one or more lines affected by the fault condition type indicated on the first group of light indicators. A housing surrounds the outlet tester circuitry and a plug extends from the housing and is configured to galvanically connect to the power outlet in order to facilitate testing thereof.

One embodiment of an electrical outlet tester includes outlet tester circuitry configured to test wiring of a power outlet to detect a plurality of wiring conditions and a set of light indicators connected to the outlet tester circuitry so as to indicate each of the plurality of wiring conditions detectable by the outlet tester circuitry. The set of light indicators includes a first group of light indicators and a second group of light indicators. The first group of light indicators includes a no-fault light indicator illuminable to indicate a no-fault condition type, an open circuit light indicator illuminable to indicate an open circuit condition type, and a reverse wiring light indicator illuminable to indicate a reverse wiring condition type. The second group of light indicators includes a ground light indicator illuminable to indicate a ground line of the power outlet, a hot light indicator illuminable to indicate at least one hot line of the power outlet, and a neutral light indicator illuminable to indicate a neutral line of the power outlet. A housing surrounds the outlet tester circuitry and a plug extends from the housing that is configured to galvanically connect to the power outlet. The outlet tester circuitry is configured to illuminate one of the first group of light indicators for each of the plurality of wiring conditions and, for at least one of the plurality of wiring conditions, to also illuminate at least one of the second group of light indicators simultaneously with the illuminated one of the first group of light indicators.

Various other features, objects, and advantages of the invention will be made apparent from the following description taken together with the drawings.

BRIEF DESCRIPTION OF THE DRAWINGS

The present disclosure is described with reference to the following Figures.

DETAILED DESCRIPTION

Miswired and faulty electrical outlets are a particular problem for recreational vehicle owners and users. Outlets for powering recreational vehicles, such as provided at RV parks and campgrounds, often have wiring problems and connection of the recreational vehicle to an outlet on a power pedestal that has a wiring fault can cause significant damage to the house power system for the recreational vehicle. This can be expensive, and even dangerous, for the recreational vehicle owner.

The inventors have recognized that currently available outlet testers, which typically utilize decoders, are problematic in that they are difficult for novices to implement effectively. Outlet testers with decoders are designed for use by electricians, and typical recreational vehicle owners do not have the background knowledge to enable effective use of these testers. For example, recreational vehicle owners have difficulty matching the various illumination patterns of the multi-light indicators to the decoder label in order to interpret the test result. In addition to the complexity of the codes used on many outlet testers, the code label is typically very small and difficult to read because it is provided on the housing of the outlet tester. Furthermore, outlets are sometimes oriented incorrectly, such as upside down, which requires the outlet tester to be oriented upside down. This makes it even more difficult for the user to decode the results provided by a standard outlet tester.

In view of the foregoing problems and challenges in the relevant art, the inventors have recognized the need for an outlet tester that can be easily interpreted to inform a user, such as a recreational vehicle owner, regarding the wiring condition of an electrical outlet. The disclosed improved codeless electric outlet tester provides a set of light indicators that includes a first group of light indicators configured to indicate a plurality of fault condition types and a second group of light indicators configured to indicate one or more lines affected by the fault condition type indicated on the first group of light indicators. For example, the first group of light indicators may include a no-fault light indicator illuminable to indicate a no-fault condition (i.e., correct wiring), an open circuit light indicator illuminable to indicate an open circuit condition (e.g., at least one of the ground, neutral, or hot lines are not connected to a circuit), and a reverse wiring light indicator illuminable to indicate a reverse wiring condition (e.g., the ground line and hot line are reversed or the neutral line and hot line are reversed). The second group of light indicators may include one light indicator for each of the ground line, the hot line, and the neutral line connections within the tested outlet. The outlet tester is configured to illuminate one light indicator from the first group to indicate the fault condition type and, in scenarios where an open circuit or reverse wiring fault is detected, to illuminate at least one of the second group of light indicators to indicate the one or more lines affected by the detected fault condition. Specific examples and embodiments are shown and described in FIGS. 1-4.

Figure 1:
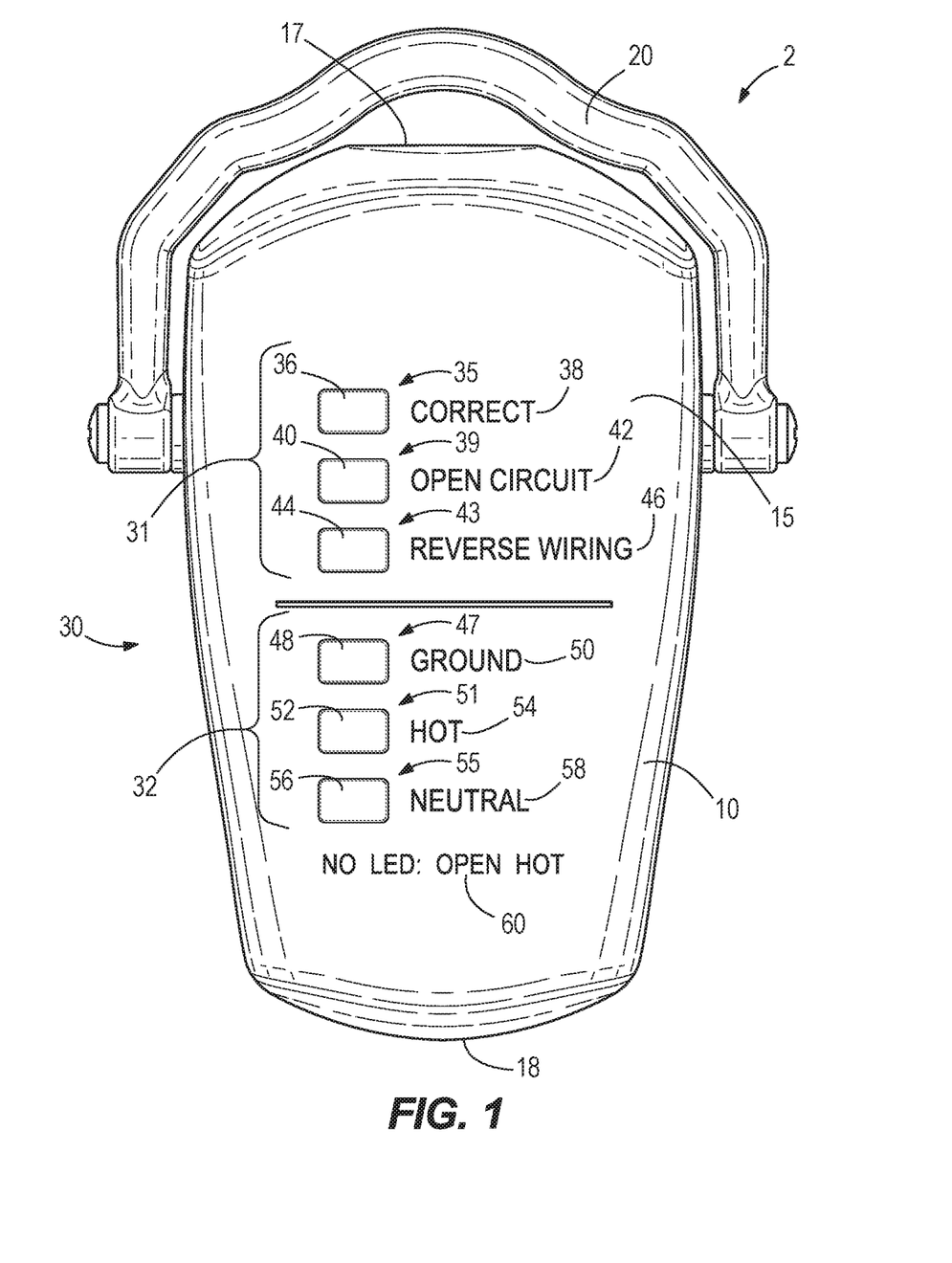
FIG. 1 depicts an exemplary codeless electrical outlet according to one embodiment of the present disclosure.

FIG. 1 depicts one embodiment of an RV electrical outlet tester 2 that is codeless and instead provides an intuitive result indicator that includes a set of light indicators 30 divided into two groups, including a first group 31 and a second group 32. The first group 31 of light indicators is configured to indicate a plurality of fault condition types, which may include an open circuit condition, a reverse wiring condition, and a no-fault condition. In the depicted example, the first group 31 includes three light indicators—a no-fault light indicator 35, an open circuit light indicator 39, and a reverse wiring light indicator 43.

The second group of light indicators 32 is configured to indicate one or more lines affected by the fault condition type indicated on the first group 31. The second group 32 of light indicators may include a ground light indicator 47 illuminable to indicate a ground line, a hot light indicator 51 illuminable to indicate at least one hot (or live) line, and a neutral light indicator 55 illuminable to indicate a neutral line. In the depicted example, each light indicator 35, 39, 43, 47, 51, 55 includes a light source visible through a respective window 36, 40, 44, 48, 52, 56 in a housing 10 of the outlet tester 2. The outlet tester 2 includes outlet tester circuitry 70 (FIG. 4) configured to control the set of light indicators 30 as described herein. The outlet tester circuitry 70 is generally configured such that for each fault condition type at least one of the first group of light indicators 31 illuminates to indicate that fault condition type. The outlet tester circuitry 70 is further configured such that for an open circuit fault condition and a reverse wiring fault condition, at least one of the light indicators from the second group of light indicators 32 is also illuminated to indicate the lines affected. Thus, in some embodiments, the outlet tester circuitry 70 is configured to illuminate only one light indicator, and in particular the no-fault light indicator 35, when the wiring is correct and no-fault condition is detected. Otherwise, two or more light indicators are illuminated for each detected fault, with the exception of an open circuit on the hot line (meaning that no power is provided by the outlet). As described herein, the tester 2 may be configured such that no light indicator illuminates when the hot line is open.

Figure 4:
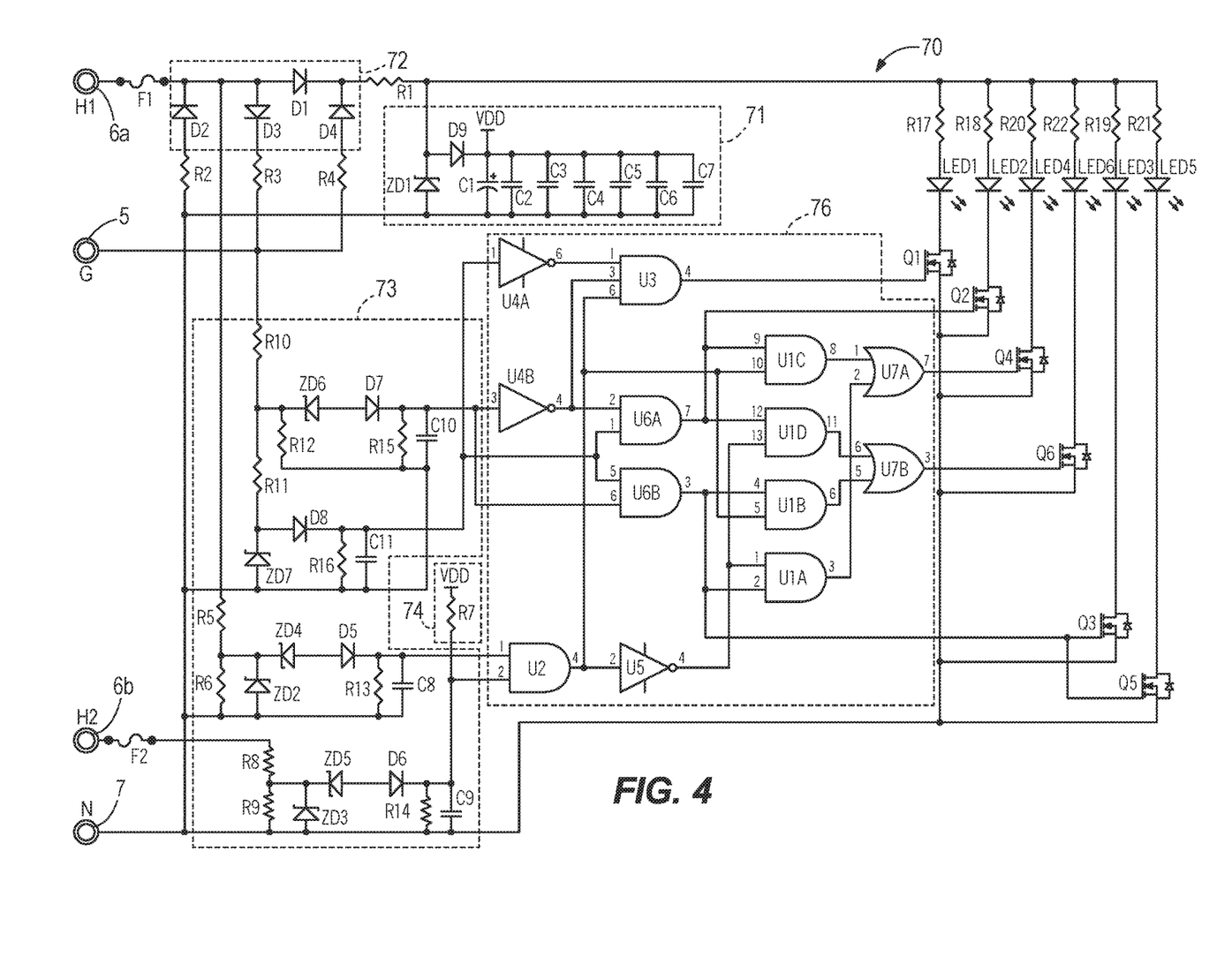
FIG. 4 is a circuit diagram for an exemplary embodiment of an RV electrical outlet tester for testing an outlet according to one embodiment of the present disclosure.

The electrical outlet tester 2 is configured to detect each of at least 5 wiring conditions of an electrical outlet including a no-fault condition (meaning that the ground, neutral, and hot lines inside the outlet are connected to the correct terminals and are operating correctly), an open ground condition (meaning that continuity is lacking between the ground terminal of the outlet and the ground of the electrical service), an open neutral condition (meaning that continuity is lacking between the neutral terminal of the outlet and the ground of the electrical service), a reverse hot and ground wiring condition (meaning that the hot and ground lines of the service are switched at the ground and hot terminals of the outlet), and a reverse hot and neutral wiring condition (meaning that the hot and neutral lines of the service are switched at the neutral and hot terminals of the outlet). A sixth wiring condition being an open hot condition may also be indicated, where no power is provided at the hot terminal and thus continuity is lacking between the hot terminal and the live line of the electrical service. With reference also to FIG. 4, one embodiment of the outlet tester circuitry 70 is configured to control illumination of the set of light indicators 30 as follows:

- Where no fault condition is detected and the wiring of a tested electrical outlet is correct, the no-fault (i.e., correct wiring) condition is indicated by illuminating a no-fault light indicator 35 in the first group;
- Where an open ground condition is detected, the open circuit light indicator 39 in the first group 31 is illuminated, along with the ground light indicator 47 in the second group 32;
- Where an open neutral condition is detected, the open circuit light indicator 39 in the first group 31 is illuminated, along with the neutral light indicator 55 in the second group 32;
- Where a reverse hot and ground wiring condition is detected, the reverse wiring light indicator 43 from the first group 31 is illuminated, along with the ground light indicator 47 and the hot light indicator 51 in the second group 32;
- Where a reverse hot and neutral wiring condition is detected, the reverse wiring light indicator 43 in the first group 31 is illuminated, along with the neutral light indicator 55 and the hot light indicator 51 in the second group 32.

Where an open hot line condition is detected, no light indicator from the set 30 will illuminate.

As illustrated in FIG. 4, the tester may be configured to be powered solely by power received from the outlet. So, in a passive tester embodiment where no battery is provided, when an open hot condition exists the tester is not powered and thus no light indicator can be illuminated. In certain embodiments, other arrangements may be provided to indicate the open hot condition. For example, the tester 2 may contain an open hot light indicator. For instance, the tester 2 may contain a battery sufficient to power the open circuit light indicator 39 and the hot line indicator 51 in the instance of an open hot condition. Alternatively or additionally, for a 50 amp outlet where two hot lines are provided, the outlet tester circuitry 70 may be configured such that where only one hot line is open, the open circuit light indicator 39 and hot line indicator 51 may illuminate.

The RV electrical outlet tester 2 may be configured for testing different standard outlet types, in particular the different outlet types utilized for powering recreational vehicles. For example, the tester 2 may be configured for testing 30 amp, 125 volt power outlets, which are generally provided by the 3-prong configuration depicted in FIGS. 2A and 2B. Alternatively, the tester 2 may be configured for testing 50 amp, 125/250 volt outlets, which in North America are generally provided with the 4-prong configuration depicted in FIGS. 3A and 3B.

Figure 2A:
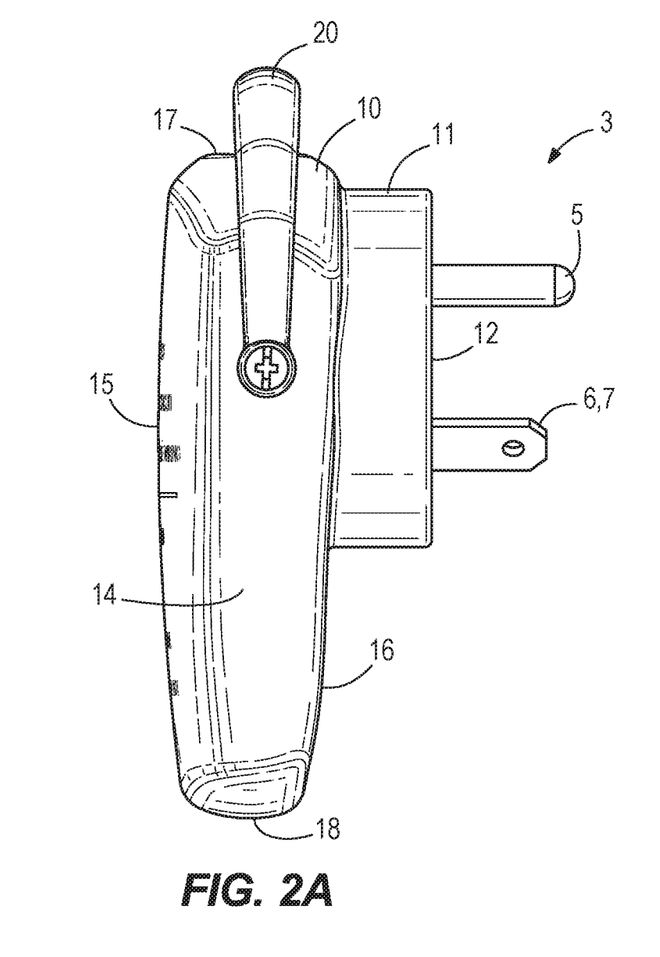
FIGS. 2A and 2B depict an embodiment of an RV electrical outlet tester for a 125 volt, 30 amp outlet.
Figure 2B:
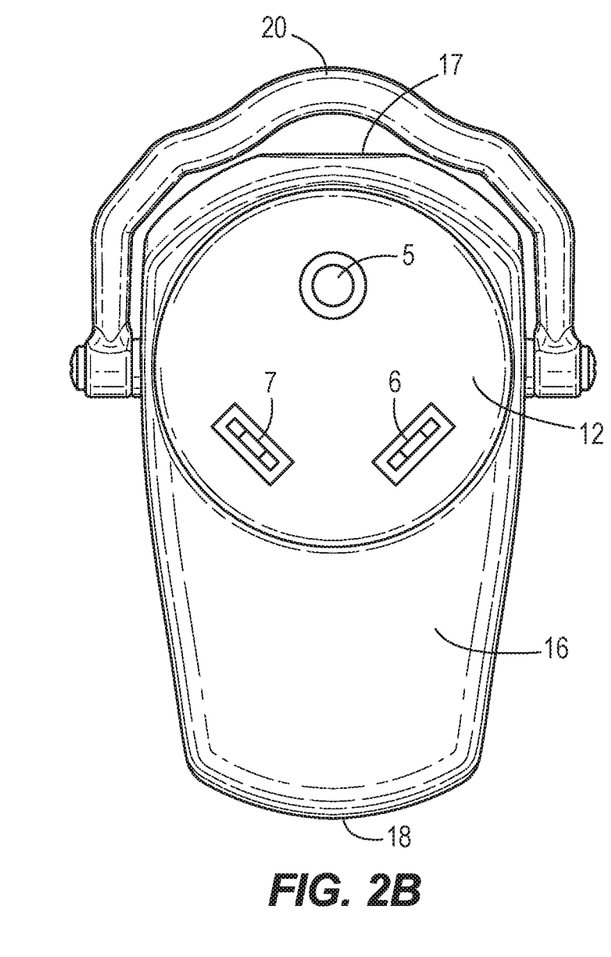
Figure 3A:
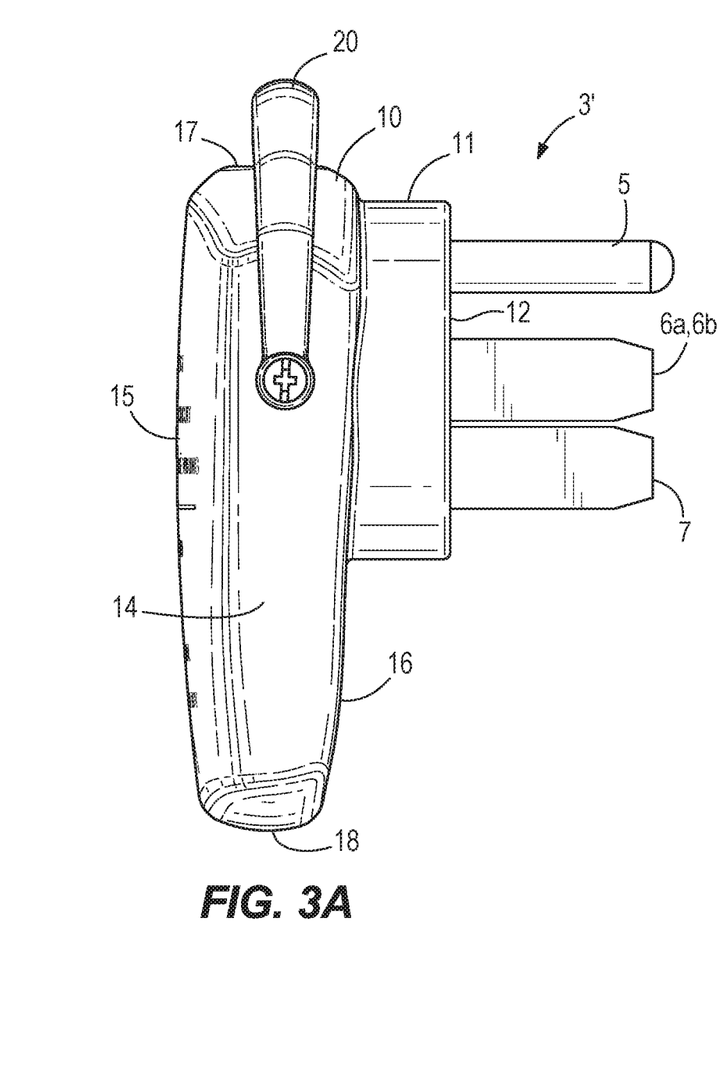
FIGS. 3A and 3B depict an exemplary embodiment of an RV electrical outlet tester for a 125/250 volt, 50 amp outlet according to another embodiment of the present disclosure.
Figure 3B:
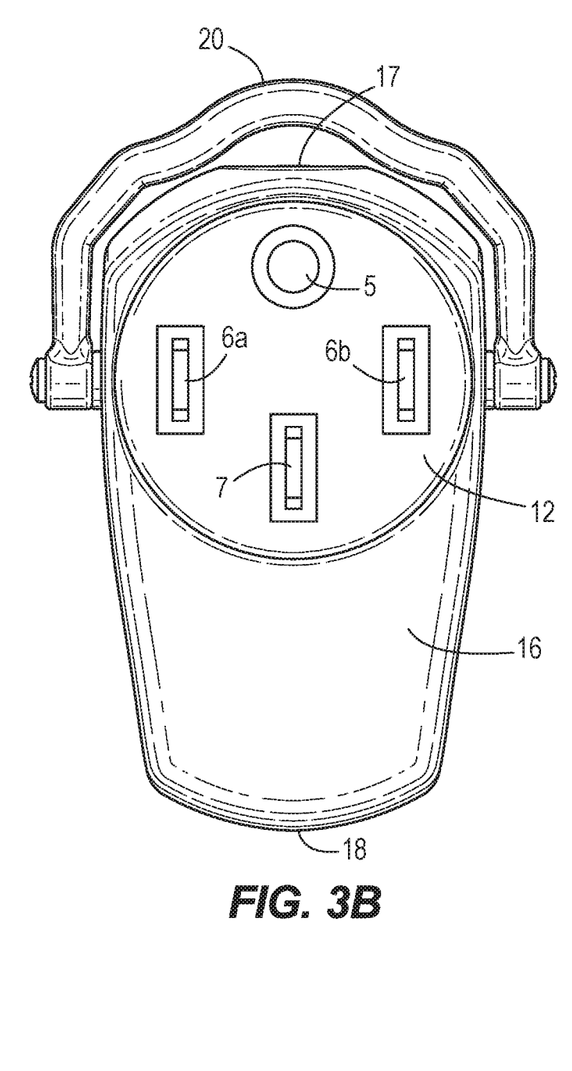

In both configurations, the plug 3 extends from the housing 10 of the tester 2. In particular, a plug portion 11 of the housing 10 extends from the back face 16. The plug portion 11 has a plug face 12 from which the prongs 5-7 of the plug 3 extend. The prongs 5-7 are sized, shaped, and arranged according to the particular established standards so that they can be inserted into the outlet so as to galvanically connect to the ground, neutral, and hot lines provided by the power outlet. The 30 amp plug 3 configuration includes a ground post 5, a hot prong 6, and a neutral prong 7, where the hot prong 6 and neutral prong 7 are tilted diagonally as illustrated in FIG. 2B. The 50 amp plug 3' includes, in addition to the ground post 5 and neutral prong 7, two hot prongs 6a and 6b arranged as shown in FIG. 3B. The 50 amp plug 3' is configured to connect to a split phase outlet where each hot line is configured to provide 125 volts at opposite phases to one another, thus two total 240 volts across the two hot lines.

The housing 10 has a front face 15, a back face 16, a top side 17, and a bottom side 18. The housing 10 surrounds and holds the outlet tester circuitry 70 and provides a set of light indicators 30, which in the depicted embodiment are provided on the front face 15. Each of the light indicators includes a light source (e.g., LED1-LED6), such as an LED or a fluorescent bulb that gets energized by the outlet tester circuitry 70. A label is provided for each light indicator that communicates the meaning of the illumination state of the light source. In the depicted example, the no-fault light indicator 35 includes a "correct" label 38, the open circuit light indicator 39 includes an "open circuit" label 42, and the reverse wiring light indicator 43 includes a "reverse wiring" label 46. Similarly, the ground light indicator 47 includes a "ground" label 50, the hot light indicator 51 includes a "hot" label 54, and the neutral light indicator 55 includes a "neutral" label 58. A label 60 may also be provided to identify that no light indicator illumination indicates an open hot condition. In the depicted example, windows 36, 40, 44, 48, 52, 56 in the housing 10 are positioned adjacent to (e.g., in front of) a corresponding light source (e.g., LED1-LED6) and adjacent to the corresponding label so that illumination by the LED is visible adjacent to the label. In the depicted example, the windows are comprised of a translucent or transparent material, such as plastic, and are provided on the front face 15 of the housing 10. In other embodiments, the windows may be positioned on a side of the tester or on any other visible surface of the housing 10. The housing includes a handle 20 that can assist in connecting and removing the electrical outlet tester 2 to and from a power outlet.

FIG. 4 depicts one embodiment of the outlet tester circuitry configured for controlling 6 light sources to indicate the fault condition type and affected lines, as described herein. The light sources include LED1 associated with the no-fault light indicator 35, LED2 associated with the open circuit light indicator 39, LED3 associated with the reverse wiring light indicator 43, LED4 associated with the ground light indicator 47, LED5 associated with the hot light indicator, and LED6 associated with the neutral light indicator 55. The ground pole 5 and the hot and neutral prongs 6 and 7 provide inputs. In the example, the outlet tester circuitry 70 can be adapted for a 50 amp plug tester configured to test two hot lines H1 and H2 connected to the two hot prongs 6a and 6b. Or, for a 30 amp tester where only one hot line H1 is tested at prong 6a, additional elements 74 (including voltage input VDD and resister R7) are provided in order to present a constant voltage, such as 5 volts, at pin 2 of logic gate U2.

The outlet tester circuitry 70 includes a powering circuit 71 that utilizes power provided from the outlet (assuming that an open hot condition is not present at the tested outlet) in order to provide power (e.g., 5 volts DC) to the elements in the circuit, including the light sources LED1-LED6. The circuit further includes sets of steering diodes 72 configured for steering current through the outlet tester circuitry 70 depending on the voltages available at the hot, neutral, and ground inputs 5-7.

Various other circuit elements 73 are also provided, including voltage dividers and filters, to present inputs to the logic circuit 76 based on the voltages provided at the plug 3 of the tester 2. The logic circuit 76 is configured to generate outputs to the driver transistors Q1-Q6 to drive the light sources LED1-LED6 based on the conditioned inputs in order to illuminate the various light indicators as described herein. In the depicted embodiment, the driver transistors Q3 and Q5 controlling power to the LED3 of the reverse wiring light indicator 43 and LED5 of the hot light indicator 51 are electrically connected, thus tying the activation of those LEDs together. Thus, whenever the reverse wiring light indicator 43 illuminates, the hot light indicator 51 also illuminates, along with one of either the neutral light indicator 55 or the ground light indicator 47 depending on the detected wiring condition. The LEDs or other light sources may be any of various colors. In one embodiment, LED1 of the no-fault light indicator 35 is a green LED and the remaining LED2-LED6 are red LEDs. Alternatively, color may be dictated by a colored window 36, 40, 44, 48, 52, 56 on the housing 10. Different coloring schemes may be used and are within the scope of the disclosure.

This written description uses examples to disclose the invention, including the best mode, and also to enable any person skilled in the art to make and use the invention. Certain terms have been used for brevity, clarity and understanding. No unnecessary limitations are to be inferred therefrom beyond the requirement of the prior art because such terms are used for descriptive purposes only and are intended to be broadly construed. The patentable scope of the invention is defined by the claims, and may include other examples that occur to those skilled in the art. Such other examples are intended to be within the scope of the claims if they have features or structural elements that do not differ from the literal language of the claims, or if they include equivalent features or structural elements with insubstantial differences from the literal languages of the claims.

We claim:

1. An electrical outlet tester for testing a power outlet for powering a recreational vehicle, the electrical outlet tester comprising:
outlet tester circuitry configured to test wiring of a power outlet for powering a recreational vehicle to detect a plurality of wiring conditions;
a set of light indicators connected to the outlet tester circuitry so as to indicate each of the plurality of wiring conditions detectable by the outlet tester circuitry, wherein the set of light indicators includes a first group of light indicators configured to indicate a plurality of fault condition types and a second group of light indicators configured to indicate one or more lines affected by the fault condition type indicated on the first group of light indicators, wherein the second group of light indicators includes a ground light indicator illuminable to indicate a ground line, a hot light indicator illuminable to indicate at least one hot line, and a neutral light indicator illuminable to indicate a neutral line;
a housing surrounding the outlet tester circuitry; and
a plug extending from the housing, the plug configured to galvanically connect to the power outlet.

2. The electrical outlet tester of claim 1, wherein the outlet tester circuitry is configured to illuminate only one light indicator out of the first group at any given time, wherein each light indicator in the first group is illuminable to indicate only one of the fault condition types.

3. The electrical outlet tester of claim 2, wherein the fault condition types include a no-fault condition, an open circuit condition, and a reverse wiring condition, and the first group of light indicators includes a no-fault light indicator, an open circuit light indicator, and a reverse wiring light indicator.

4. The electrical outlet tester of claim 1, wherein the fault condition types include an open circuit condition and a reverse wiring condition, and wherein for each of the open circuit condition and the reverse wiring condition the outlet tester circuitry is configured to illuminate a corresponding one of the first group of light indicators and at least one of the second group of light indicators.

5. The electrical outlet tester of claim 4, wherein for the reverse wiring condition the outlet tester circuitry is configured to illuminate a corresponding one of the first group of light indicators and two of the second group of light indicators.

6. The electrical outlet tester of claim 1, the outlet tester circuitry is configured to detect at least five wiring conditions including: a no-fault condition, an open ground condition, an open neutral condition, a reverse hot and ground wiring condition, and a reverse hot and neutral wiring condition.

7. The electrical outlet tester of claim 6, wherein the outlet tester circuitry is configured to illuminate one light indicator to indicate the no-fault condition and to illuminate at least two light indicators to indicate each of the other wiring conditions.

8. The electrical outlet tester of claim 6, wherein the outlet tester circuitry is configured such that:
the no-fault condition is indicated by illuminating a no-fault light indicator in the first group;
the open ground condition is indicated by illuminating an open circuit light indicator in the first group and a ground light indicator in the second group;
the open neutral condition is indicated by illuminating the open circuit light indicator in the first group and a neutral light indicator in the second group;
the reverse hot and ground wiring condition is indicated by illuminating a reverse wiring light indicator in the first group, and the ground light indicator and a hot light indicator in the second group; and
the reverse hot and neutral wiring condition is indicated by illuminating the reverse wiring light indicator in the first group, and the neutral light indicator and the hot light indicator in the second group.

9. The electrical outlet tester of claim 1 configured to test a 50 amp power outlet for powering the recreational vehicle, the 50 amp power outlet providing two hot lines.

10. The electrical outlet tester of claim 9, wherein the second group of light indicators includes a ground light indicator illuminable to indicate a ground line, a hot light indicator illuminable to represent both of the two hot lines, and a neutral light indicator illuminable to indicate a neutral line.

11. The electrical outlet tester of claim 1 configured to test a 30 amp power outlet for powering the recreational vehicle.

12. An electrical outlet tester comprising:
outlet tester circuitry configured to test wiring of a power outlet to detect a plurality of wiring conditions;
a set of light indicators connected to the outlet tester circuitry so as to indicate each of the plurality of wiring conditions detectable by the outlet tester circuitry, wherein the set of light indicators includes:
a first group of light indicators including:
a no-fault light indicator illuminable to indicate a no-fault condition type;
an open circuit light indicator illuminable to indicate an open circuit condition type;
a reverse wiring light indicator illuminable to indicate a reverse wiring condition type;
a second group of light indicators including:
a ground light indicator illuminable to indicate a ground line of the power outlet;
a hot light indicator illuminable to indicate at least one hot line of the power outlet;
a neutral light indicator illuminable to indicate a neutral line of the power outlet;
a housing surrounding the outlet tester circuitry;
a plug extending from the housing, the plug configured to galvanically connect to the power outlet; and
wherein the outlet tester circuitry is configured to illuminate one of the first group of light indicators for each of the plurality of wiring conditions and, for at least one of the plurality of wiring conditions, to also illuminate at least one of the second group of light indicators simultaneously with the illuminated one of the first group of light indicators.

13. The electrical outlet tester of claim 12, wherein the tester circuitry is configured such that only one light indicator out of the first group of light indicators is illuminable at any given time.

14. The electrical outlet tester of claim 12, wherein the fault condition types include an open circuit condition and a reverse wiring condition, and wherein for each of the open circuit condition and the reverse wiring condition the outlet tester circuitry is configured to illuminate a corresponding one of the first group of light indicators and at least one of the second group of light indicators.

15. The electrical outlet tester of claim 14, wherein for the reverse wiring condition the outlet tester circuitry is configured to illuminate the reverse wiring light indicator and two of the second group of light indicators corresponding to the lines that are reversed.

16. The electrical outlet tester of claim 12, the outlet tester circuitry is configured to detect at least five wiring conditions including: a no-fault condition, an open ground condition, an open neutral condition, a reverse hot and ground wiring condition, and a reverse hot and neutral wiring condition.

17. The electrical outlet tester of claim 16, wherein the outlet tester circuitry is configured such that:

the no-fault condition is indicated by illuminating the no-fault light indicator in the first group;

the open ground condition is indicated by illuminating the open circuit light indicator in the first group and the ground light indicator in the second group;

the open neutral condition is indicated by illuminating the open circuit light indicator in the first group and the neutral light indicator in the second group;

the reverse hot and ground wiring condition is indicated by illuminating the reverse wiring light indicator in the first group, and the ground light indicator and the hot light indicator in the second group; and the reverse hot and neutral wiring condition is indicated by illuminating the reverse wiring light indicator in the first group, and the neutral light indicator and the hot light indicator in the second group.

18. The electrical outlet tester of claim 12 configured to test a 50 amp power outlet for powering a recreational vehicle, the 50 amp power outlet providing two hot lines, wherein the hot light indicator is illuminable to represent both of the two hot lines.

19. The electrical outlet tester of claim 12 configured to test a 30 amp power outlet for powering a recreational vehicle.

* * * * *